United States Patent

Itsuji et al.

[11] Patent Number: 5,824,895
[45] Date of Patent: Oct. 20, 1998

[54] AIR FLOW METER OF A HEATING RESISTOR TYPE

[75] Inventors: Takayuki Itsuji; Masao Akamatsu, both of Hitachinaka, Japan

[73] Assignee: Hitachi, Ltd. and Hitachi Car Engineering Co., Ltd., Japan

[21] Appl. No.: 925,070

[22] Filed: Sep. 8, 1997

Related U.S. Application Data

[63] Continuation of Ser. No. 645,099, May 13, 1996, abandoned.

[30] Foreign Application Priority Data

May 12, 1996 [JP] Japan .................................... 7-114648

[51] Int. Cl.$^6$ ....................................................... G01F 1/68
[52] U.S. Cl. ........................................ 73/204.17; 73/204.11
[58] Field of Search ............................. 73/204.11, 204.18, 73/204.15, 204.16, 204.17

[56] References Cited

U.S. PATENT DOCUMENTS 4,400,974  8/1983  Nishimura et al. .................. 73/204.15
4,682,496  7/1987  Miura et al. .......................... 73/204.23
5,537,871  7/1996  Itsuji et al. ............................ 73/204.17

FOREIGN PATENT DOCUMENTS 60-100218  6/1985  Japan .

Primary Examiner—Ronald L. Biegel
Assistant Examiner—Jewel V. Thompson
Attorney, Agent, or Firm—Evenson, McKeown, Edwards & Lenahan, P.L.L.C.

[57] ABSTRACT

A heating resistor type air flow meter for measuring the amount of air flow which passes through an intake pipe for an internal combustion engine. The air flow meter has a constant-temperature control circuit for detecting air flow, which has a bridge circuit including a heating resistor and a temperature-sensitive resistor each provided in the intake pipe, and a power amplifier circuit for amplifying a signal from the constant-temperature control circuit to generate an air flow signal. The power amplifier circuit has a plurality of amplification resistors which determine a mu-factor for the amplifier to correct the amount of air flow with respect to variation of temperature. At least an amplification resistor has a temperature coefficient different form that of the other amplification resistor, to compensate variation of the mu-factor of the power amplifier circuit.

5 Claims, 9 Drawing Sheets

AIR FLOW METER OF A HEATING RESISTOR TYPE

This application is a continuation of application Ser. No. 08/645,099, filed on May 13, 1996 now abandoned.

BACKGROUND OF THE INVENTION

The present invention relates to an air flow meter, and more particularly to an air flow meter used to control an engine for vehicles.

From the viewpoint of the protection of an environment and the saving of natural resources, it is required to control an engine for vehicles with a high degree of accuracy. Therefore, an improved air flow meter is to be desired, which can detect accurately the amount of intake air. One of such a prior art is disclosed in Japanese Patent Application Laid-Open No. 60-100218 (1985), in which the measured value is corrected in accordance with variation of temperature of intake air by adjusting a current flowing through a Zener diode in a power circuit of an air flow meter of a heating resistor type.

However, the temperature-correction described in the above prior art is nothing but changing a voltage in accordance with the temperature of intake air, regardless of the amount of the air flow to be measured. Therefore, the temperature-correction for the air flow signal can be made only at an arbitrary air flow amount point. Because, in fact, an air flow signal indicative of the amount of air flow changes in accordance with the temperature of the air flow which flows over a heating resistor, that is, because the magnitude of an air flow signal depends upon the temperature of intake air, the air flow signal can not be temperature-corrected for the whole range of the amount of air flow. Accordingly, it is impossible to detect accurately intake air over the whole range of the amount of air flow.

SUMMARY OF THE INVENTION

An object of the present invention is to provide an improved air flow meter of a heating resistor type which can detect the amount of air flow with a high degree of accuracy by temperature-correcting air flow signals over the whole range of the amount of air flow in accordance with the variation of temperature of the air flow to be measured.

PREFERRED EMBODIMENTS OF THE INVENTION

Embodiments of the present invention will be explained with reference to drawings.

Figure 1:
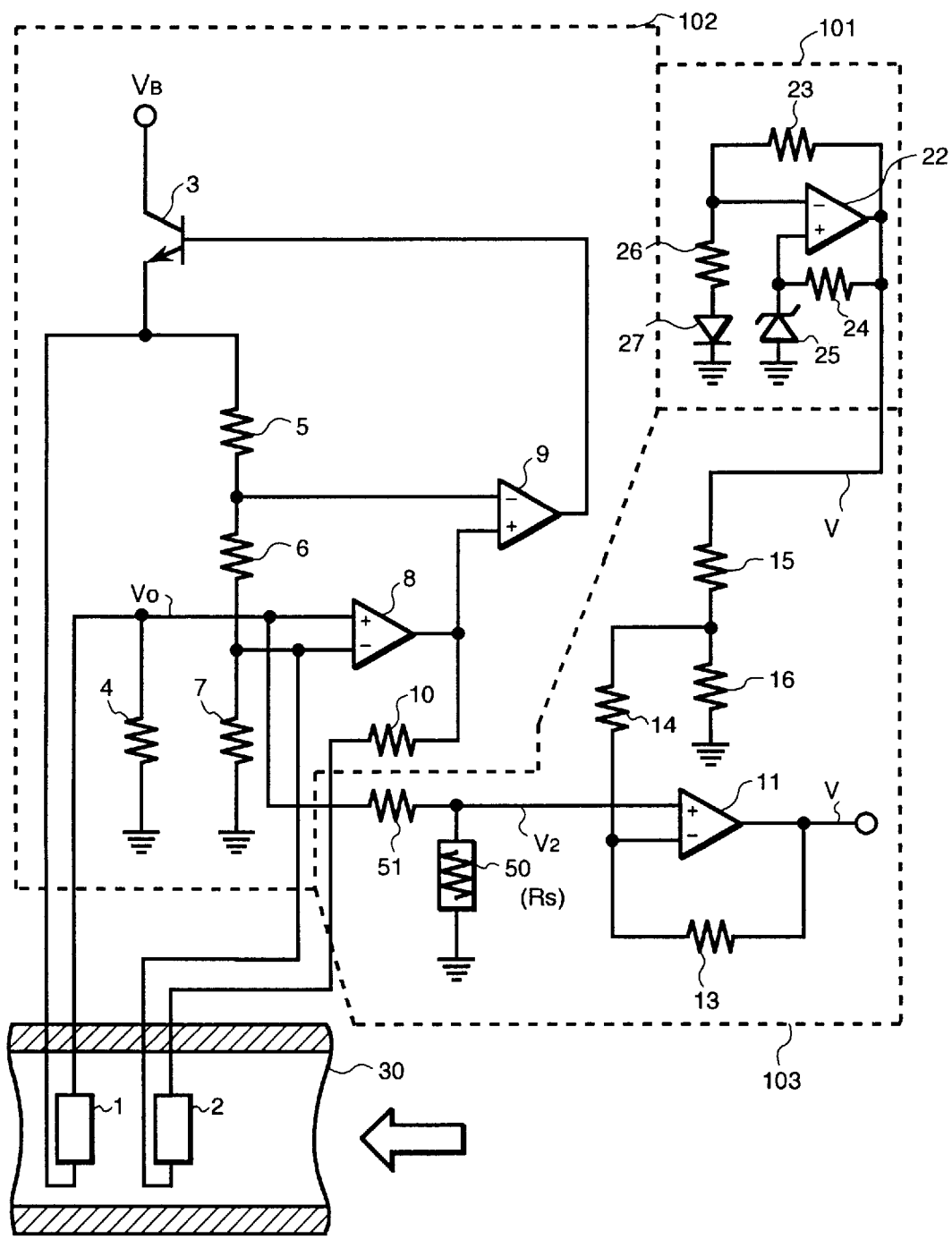
FIG. 1 is a circuit diagram showing an air flow meter of a heating resistor type according to an embodiment of the present invention.
Figure 2:
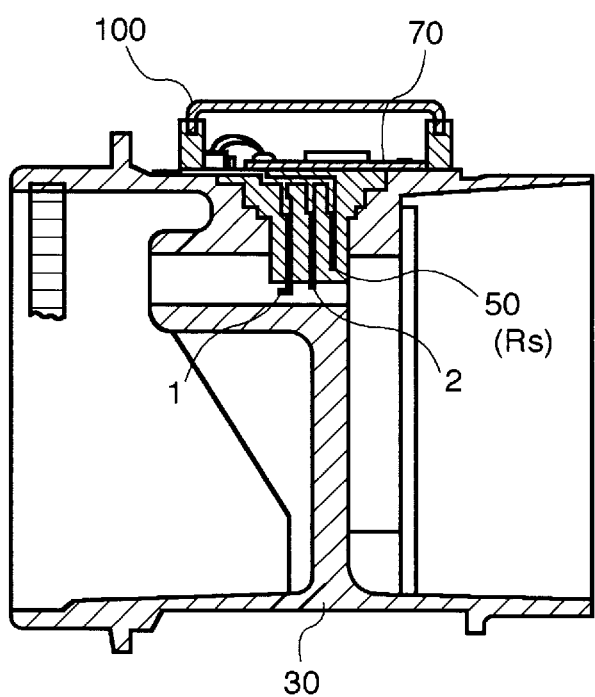
FIG. 2 is a sectional view of an air flow measuring part equipped with the air flow meter of a heating resistor type shown in FIG. 1.

FIG. 1 is a circuit diagram showing an air flow meter of a heating resistor type according to an embodiment of the present invention. FIG. 2 is a sectinal view of an air flow measuring part equipped with the air flow meter of a heating resistor type shown in FIG. 1. The construction and operation of the embodiment will be explained.

The air flow meter of a heating resistor type shown in FIG. 1 includes a heating resistor 1 and a temperature-sensitive resistor 2 for measuring the amount of air flow, which are mounted on an air passage 30, a constant-temperature controll circuit 102 connected to the heat resistor 1 and the temperature-sensitive resistor 2, a output amplifier circuit 103, and a power circuit 101. A reference resistor 4 in the constant-temperature control circuit 120 is provided to convert a current which flows through the heating resistor 1 into a voltage signal. The reference resistor 4 forms a bridge circuit which functions to allow the heating resistor 1 to keep at the predetermined temperature, along with the heating resistor 1 and the temperature-sensitive resistor 2. The above-mentioned circuit is well-known as a so-called air flow meter of a hot wire type. Therefore, the description of the construction and its operation is abbreviated in this specification.

In the embodiment shown in FIG. 2, the heating resistor 1 and the temperature-sensitive resistor 2 are provided in the air passage 30 of the intake pipe for an internal combustion engine. An air flow measuring part 100 includes a substrate 70 into which a detecting part comprised of the heating resistor 1 and the temperature-sensitive resistor 2 and the constant-temperature control circuit 102 are integrated.

In operation, when the heating resistor 1 is controlled to be at a constant temperature, a current Ih which flows to the reference 4 changes according to the mount of air flow Q which passes through the air passage 30, as illustrated in equation 1a.

$$Ih^2 Rh = (0.32\lambda/D + 0.43\sqrt{\rho v} \sqrt{D/\rho v} \cdot \lambda/D)(Th - Ta)S \quad (1a)$$

where, S: surface area of a heating resistor ($m^2$).

D: outer diameter of the heating resistor (m).

$\lambda$: coefficient of heat-transfer of air (kcal/m hr °C.).

$\rho$: density of air ($kg/m^3$).

$\upsilon$: coefficient of active viscosity of air ($m/s^2$).

v: velocity of air flow (m/s).

As understood from the above equation, the above parameters depend upon the air temperature Ta (°C.) except the parameters S, D and v.

The following equation is obtained by symplifying the above equation.

$$Ih^2 Rh = (A + B\sqrt{Q})(Th - Ta) \quad (1b)$$

where,

Rh: a resistance value of the heating resistor 1 during heating.

A, B: a constant of the heating resistor 1.

Th: heating temperature of the heating resistor 1.

Ta: temperature of intake air.

Therefore, A and B of the equation (1) is a function of temperature, that is, $A = f(Ta)$, $B = g(Ta)$.

Further, the terminal voltage Vo or voltage signal obtained by converting a current which flows through the reference resistor 4 changes according to the mount Q of air flow, as shown in the following equation (2).

$$Vo = (R4/\sqrt{Rh})\sqrt{(f(Ta) + g(Ta)\sqrt{Q})(Th - Ta)} \quad (2)$$

where, R4: a resistance value of the heating resistor 4. Provided $\Delta Th = (Th - Ta)$ is maintained to be constant by controlling Th by using the bridge circuit and the temperature-sensitive resistor Rc even if the air temperature Ta changes.

Next, the terminal voltage Vo of the reference resistor 4 is devided by resistors 50 and 51 for amplification which form a power amplifier circuit 103. The power amplifier circuit 103 further includes a differential amplifier 11, and a plurality of resistors 13, 14, 15 and 16 for amplification, and outputs the voltage shown in the equation (3). The power circuit 101 is the same structure as one disclosed in Japanese Patent Application Laid-Open No. 60-100218 (1985), and has the function of temperature-correction.

Therefore, the output voltage Vout, that is, the voltage signal converted from the current passed through the reference resistor 4, can be expressed by the following equation (3).

Vout=[(Rs/(R51+Rs))(1+((R15+R16)R13)/(R14R15+R15R16+R16R14)]Vo−[(R16R13)/(R14R15+R15R16+R16R14)]Vref  (3)

where,

Vout: an output voltage,

Vref: an reference voltage supplied from the power circuit 101,

R13: resistance value of the resistor 13,

R14: resistance value of the resistor 14,

R15: resistance value of the resistor 15,

R16: resistance value of the resistor 16,

R51: resistance value of the resistor 51,

Rs: resistance value of the different type of resistor 50.

Further, $(A+B\sqrt{Q})$ corresponds to the coefficient of heat-transfer h. In general, it is known, as shown in FIG. 3, that the coefficient h of heat-transfer depends upon the temperature Ta of intake air.

Figure 3:
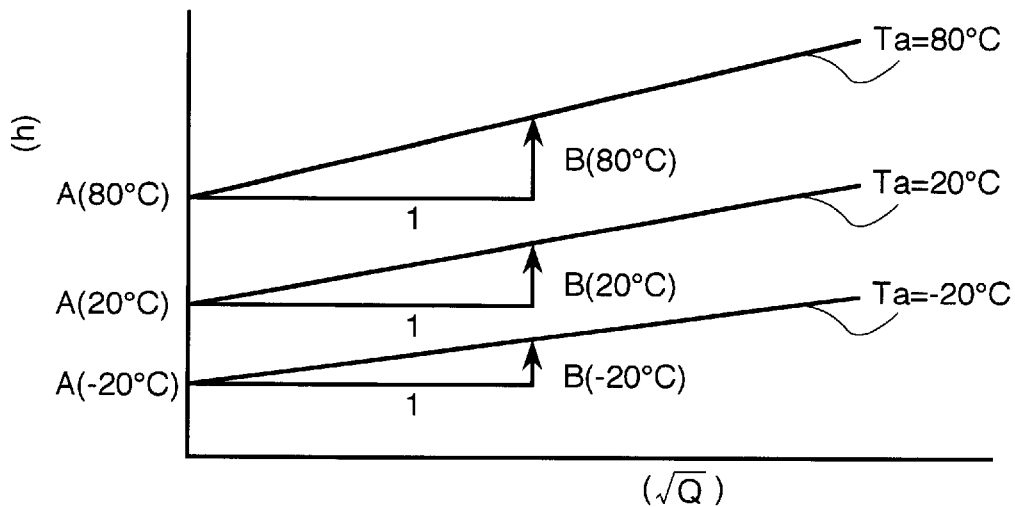
FIG. 3 is a gragh illustrating the relationship between the amount of air flow and the coefficient of heat-transfer.

FIG. 3 is a gragh illustrating the relationship between the amount ($\sqrt{Q}$) of air flow and the coefficient h of heat-transfer. The coefficient h of heat-transfer is a linear function of the mount $\sqrt{Q}$ of air flow with gradient B. In FIG. 3, A is a point at which the linear function crosses axis of coordinates. The point A and the gradient B each has the temperature Ta of intake air as a parameter.

Therefore, in a way similar to the prior art, even if the variation of output with respect to the variation of temperature at certain amount of air flow can be suppressed to zero by providing the function of temperature correction to the power circuit 101, that is, even if only the power circuit 101 with the function of temperature-correction allows an error of the amount of air flow with respect to the variation of temperature to be zero at the amount Qa of air flow or a certain point of air flow amount, a detection error (dQ/Q) may occur at another point of air flow amount. As a result, it is impossible to correct all of the errors.

Figure 4:
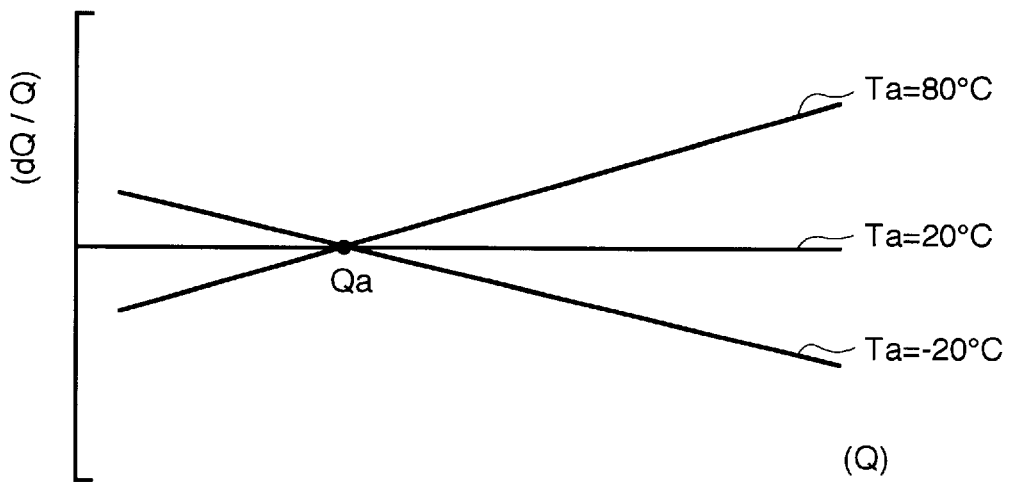
FIG. 4 is a gragh illustrating the relationship between the amount of air flow and errors.

FIG. 4 is a gragh illustrating the relationship between the amount of air flow and errors. In FIG. 4, the temperature is corrected on the basis of the reference temperature Ta=20° C. of intake air. Accordingly, an error do not occur at Ta=20° C. However, in case of Ta=−20° C., or Ta=80° C. deviating from the reference temperature, an error becomes zero only at one point of air flow, namely at certain amount Qa of air flow, but an error occurs at another point of air flow.

The dependence of the amount of air flow on the temperature of intake air has been explained hereinbefore. Next, the present invention will be described in detail.

Among a plurality of resistors for amplification used to determine a mu-factor of the differential amplifier in the power amplifier circuit 103, one resistor 50 for amplification is set as a different kind of resistor Rs and the temperature coefficient of the different kind of resistor Rs or resistor 50 is set to be different from that of other resistors for amplification. Namely, for example, the resistor 50 connected between the ground side and the terminal voltage side of the reference resistor 4 at an input stage of the power amplifier circuit 103 is set as a different kind of resistor 50, of which the temperature coefficient is α different from that of another resistor. The temperature coefficients of other resistors are set to be β. The resistor 50 is referred to as a different kind of resistor 50 or a different kind of resistor Rs hereinafter.

The output voltage Vout in equation (3) can be converted as the following equation (4).

Vout=[(1+αTa)·Rso/((1+βTa)·R51o+(1+αTa)Rso)]·a·Vo−b·Vref  (4)

where,

R51o: resistance value of R51 at 0° C.

Rso: resistance value of R50 at 0° C.

α: coefficient of temperature of Rs(R50)

β: coefficient of temperature of R13, R14, R15, R16 and R51 a: resistance ratio, and a=1+((R15+R16)R13)/(R14R15+R15R16+R16R14)

b: resistance ratio, and b=(R16R13)/(R14R15+R15R16+R16R14)

(a and b are constant without regard to temperature)

By selecting suitable temperature coefficients α, β and resistance ratio a, b, it becomes possible to eliminate the dependence of the heat-transfer coefficient on the temperature of intake air, and correct the output voltage Vout which is output as an air flow amount signal, with respect to the variation of the temperature of air flow.

In further detail, provided that in equation (4), $$C = \frac{(1 + \alpha Ta)Rso}{(1 + \beta Ta)R51o + (1 + \alpha Ta)Rso}$$

the above equation can be expressed as C=h(Ta), because C is a function of Ta. Accordingly, $$\text{Vout} = C \cdot a \cdot Vo - b \cdot Vref \quad (5)$$

$$= h(Ta) \cdot a \cdot R4 \sqrt{f(Ta) + g(Ta)\sqrt{Q} \; \Delta Th} \; / \sqrt{R} \; h - b \cdot Vref$$

$$= \sqrt{h^2(Ta) \cdot a^2 \cdot R4^2 \cdot [f(Ta) + g(Ta)\sqrt{Q} \; \Delta Th]/Rh} \; - b \cdot Vref$$

$$= \sqrt{h^2(Ta) \cdot a^2 \cdot R4^2 \cdot f(Ta)/Rh + h^2(Ta) \cdot a^2 \cdot R4^2 \cdot g(Ta)\sqrt{Q} \; \Delta Th/Rh} \; - b \cdot Vref$$

where, $h^2(Ta) \cdot a^2 \cdot R4^2 \cdot f(Ta)/Rh$ (which does not depend upon the amount of air flow)

$h^2(Ta) \cdot a^2 \cdot R4^2 \cdot f(Ta)/Rh$ (which depends upon the amount of air flow)

The term which does not depend upon the amount of air flow, along with a constant b, can be cancelled by providing with the dependence of Vref on temperature.

On the contrary, with regard to the term which depends upon the amount of air flow, it becomes possible to cancel the dependence on temperature by setting to $h^2(Ta)=1/g(Ta)$. Namely, by selecting suitable parameters of $h^2(Ta), \alpha, \beta$, Rso and R51o, it becomes possible to allow $h^2(Ta)$ to be closely analogous to $1/g(Ta)$, and thus eliminate the dependence on temperature. For example, by measuring the characteristics of temperature to air flow amount by experiment and making approximations, it becomes possible to determine the resistors Rso and R51o which can eliminate the dependence on temperature, it becomes further possible to select the material (resistor) with the parameters, $\alpha$ and $\beta$. Because $\alpha$ and $\beta$ are determined by the kind of resistors, it is easy to determine the resistors Rso and R51o.

In the above-mentioned embodiment, only one resistor 50 has been selected as a different kind of resistor Rs in the correcting means, which is constructed to cancel the variation of the mu-factor of the voltage signal (i.e. air flow amount signal) converted from the current which flows through the reference resistor 4. However, if the effect of the temperature Ta of intake air is eliminated, it is not limited to one resistor.

Figure 5:
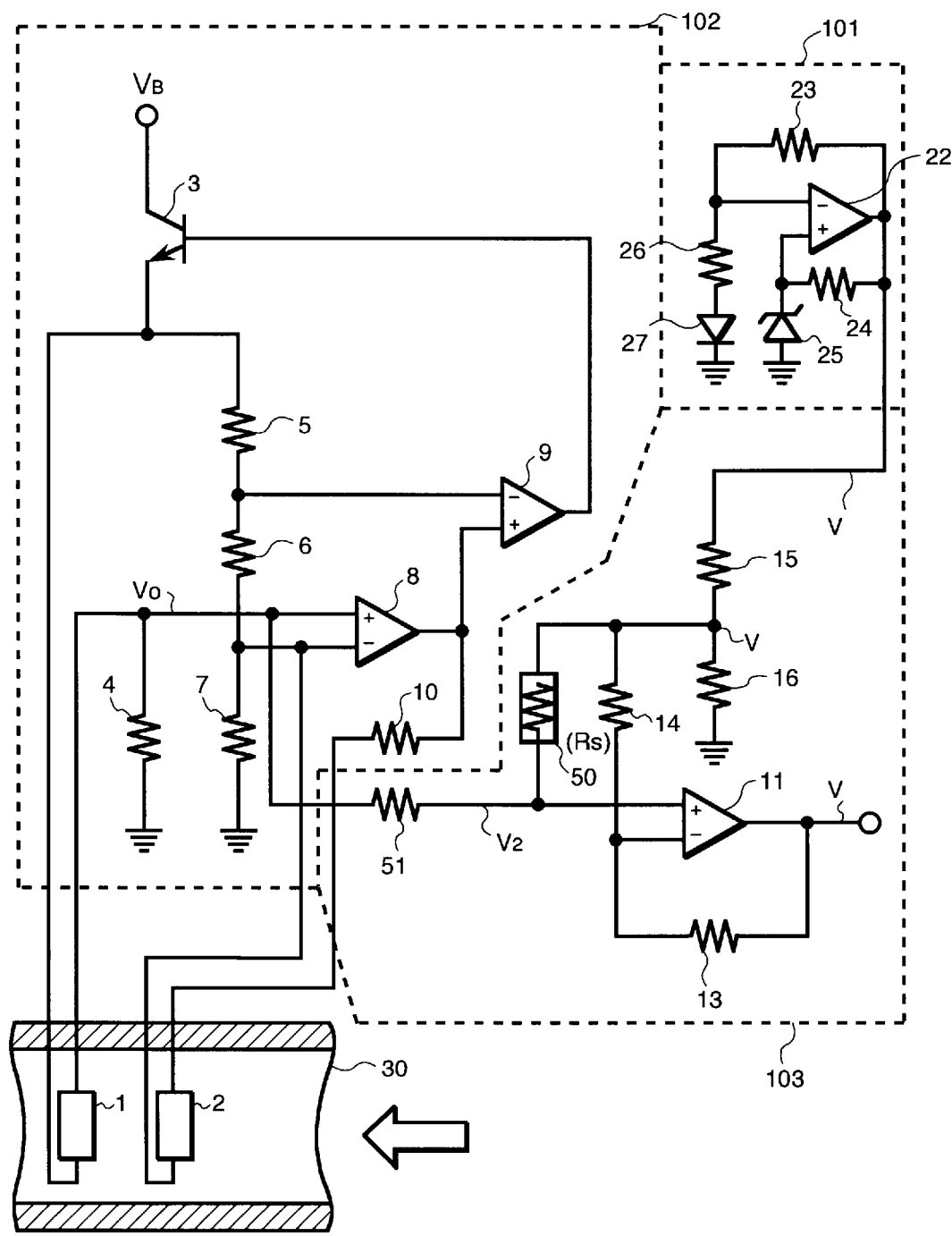
FIG. 5 is a circuit diagram showing the air flow meter of a heating resistor type according to another embodiment of the present invention.

FIG. 5 is a circuit diagram showing an air flow meter of a heating resistor type according to another embodiment of the present invention. In FIG. 5, a different kind of resistor with the temperature coefficient different from other resistors is connected between the terminal voltage side of the different kind of resistor and a limit voltage point (Vsn). Namely, the correcting means is connected between the terminal voltage side of the reference resistor at an input stage of the power amplifier circuit and the limit voltage point.

The output voltage Vout of the present embodiment is as follows.

$$\text{Vout}=(Rs/(R51+Rs))(1+(R13/R14))(Vo-Vsn)+Vsn \quad (5)$$

where, $R51 \gg R16$, $Rs \gg R16$, $Vsn=(R16/(R15+R16))$ Vref

Generally, the mu-factor of the power amplifier circuit 103 is determined by a plurality of resistors 13, 14, 15 and 16. However, it is determined only by the resistors R51 and Rs in the embodiment shown in FIG. 5. Namely, the effect of variations of resistors R13, R14, R15, R16 and variation of temperature on the mu-factor can be lessened.

Figure 6:
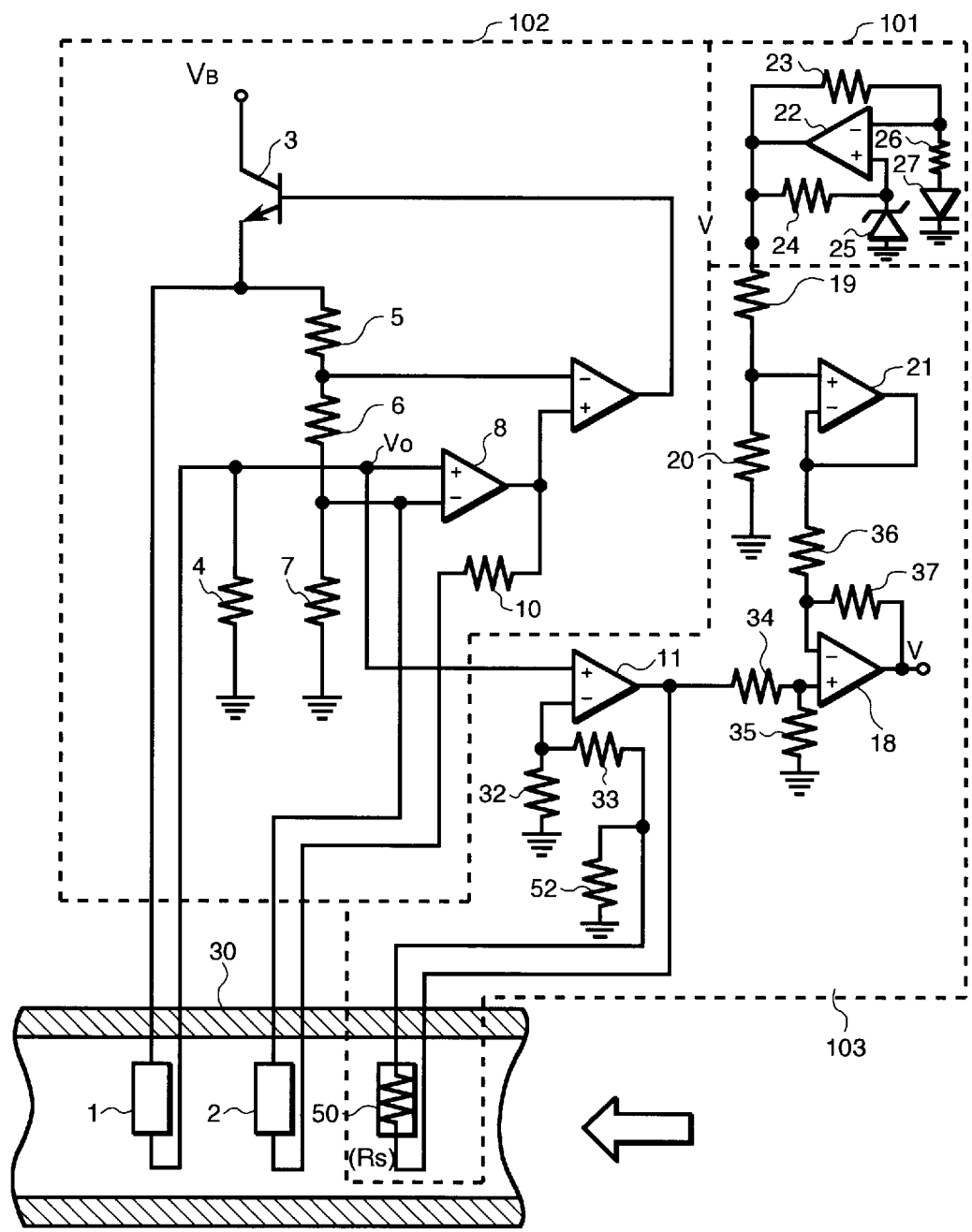
FIG. 6 is a circuit diagram showing the air flow meter of a heating resistor type according to a further embodiment of the present invention.

FIG. 6 is a circuit diagram showing an air flow meter of a heating resistor type according to a further embodiment of the present invention. In FIG. 6, the different kind of resistor 50 with the coefficient of temperature different from other resistors is connected in a feedback path of the differential amplifier. Namely, the correcting means is connected in the feedback path of the differential amplifier.

In the embodiment shown in FIG. 6, the output voltage Vout is as follows.

$$\text{Vout}=[(R32o+R33o+Rso(1+\alpha Ta)/(1+\beta Ta))/R32o]Vo-(R20o/(R19o+R20o))Vref \quad (6)$$

where,

R32o: resistance value of resistor 32 at 0° C.

R33o: resistance value of resistor 33 at 0° C.

R19o: resistance value of resistor 19 at 0° C.

R20o: resistance value of resistor 20 at 0° C.

Rso: resistance value of resistor 50 at 0° C.

Resistors 19, 20, 32, 33, 34, 35, 36 and 37 are used for amplification. Further, resistors R34, R35, R36 and R37 each has the same resistance value.

Also in this case, it is possible to correct the dependence of the heat-transfer coefficient of Vo on the temperature of intake air by selecting suitable coefficient arufa, beta of temperature. If it is possible to lessen the fall voltage of the different kind of resistor Rs, a pull-down resistor shown in FIG. 6 is not required.

Figure 7:
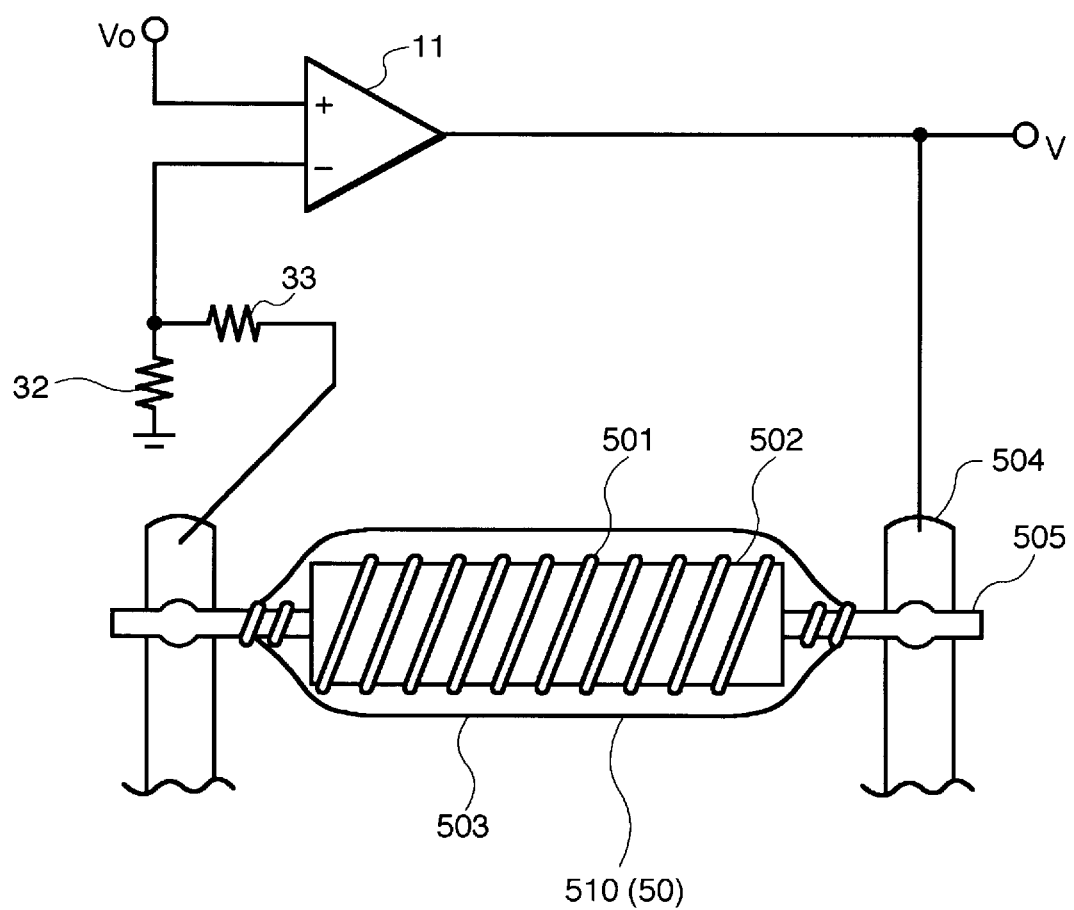
FIG. 7 is a schematic view showing another embodiment of a different kind of resistor Rs.

FIG. 7 is a shcematic view showing another embodiment of a different kind of resistor Rs. While the different kind of resistors shown in FIGS. 1 to 6 has been a normal carbon coating resistor, a metal coating resistor, or a resistor made from resistance paste for print, the different kind of resistor Rs or resistor 510 has the same structure as the temperature-sensitive resistor 2. The resistor 510 comprises a bobbin 502, a platinum wire wound around the bobbin 502, glass or insulator 503 which covers the bobbin and the platinum wire. The platinum wire is connected electrically through a lead 505 and a support member 504 to the differential amplifier 11. The temperature coefficient $\alpha$ of the resistor 510 made from a platinum wire, etc. is 3870 ppm/°C., that is, $\alpha \gg 1$. Therefore, it is far different from the temperature coefficient $\beta$(100 ppm/°C.) of the resistors 13, 14 which are carbon coating resistors or metal coating resistors. Therefore, it is possible to correct the dependence of Vo on temperature by setting suitably the value of resistance of the platinum wire at 0° C. Namely, it becomes possible to eliminate the dependence of the heat-transfer coefficient on the temperature of intake air Ta.

Figure 8:
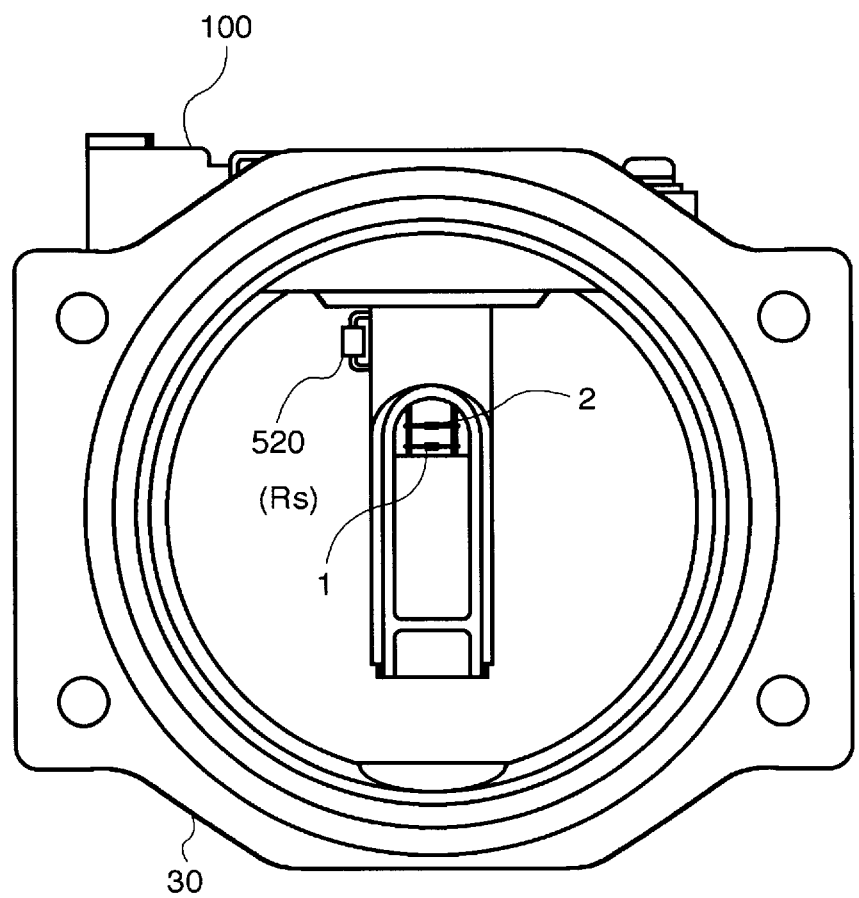
FIG. 8 is a schematic view showing a further embodiment of a different kind of resistor Rs.

FIG. 8 is a schematic view showing a further embodiment of a different kind of resistor Rs. In FIG. 8, the different kind of resistor is a thermistor 520. Further, in the air flow amount measuring part 100 of FIG. 8, the thermistor 520 along with the heating resistor 1 and the temperature-sensitive resistor 2 is provided in the air passage 30 or intake pipe for internal combustion engine.

The value Rt of resistance of the thermistor 520 is generally expressed as follows.

$$Rs=Rt=Rto \cdot EXP[B((1/Ta)-(1/To))] \quad (7)$$

Rto: resistance value of thermistor

B: temperature constant of thermistor

To: 273 K

Therefore, as in the case of the above-mentioned embodiment, it is possible to correct the dependence of Vo on temperature by selecting a suitable thermistor with appropriate value B.

Figure 9:
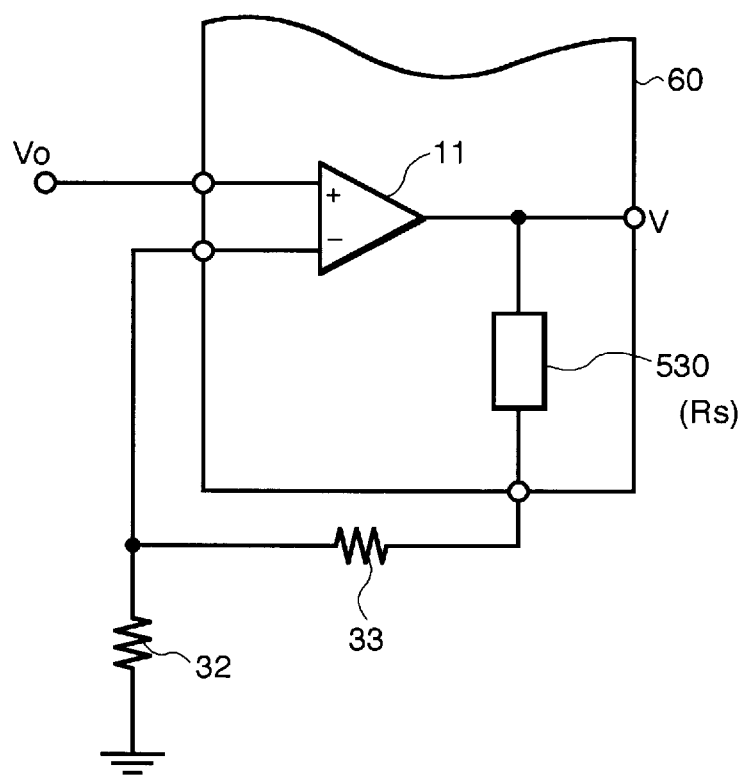
FIG. 9 is a circuit diagram showing a further embodiment of a different kind of resistor Rs.

FIG. 9 is a circuit diagram showing a further embodiment of a different kind of resistor Rs. The different resistor 50 is a monolithic resistor 530 incorporated in an IC chip 60. The temperature coefficient of monolithic resistor 530 in the IC chip 60 is normally larger than 1000 ppm/°C. Therefore, it is different from the temperature coefficient of other resistors for amplification.

Accordingly, it is possible to correct the dependence of Vo on temperature by selecting approprietly the temperature coefficient of the monolithic resistor 530.

Because it is difficult to blow an intake air only on monolithic resistor 530, it is required to prevent the deterioration of the precision of correction. Therefor, the IC chip including the monolithic resistor 530 is integrated in a substrate 70 of the power amplifier circuit 103, and the whole substrate is provided into intake air as shown in FIG. 10.

Figure 10:
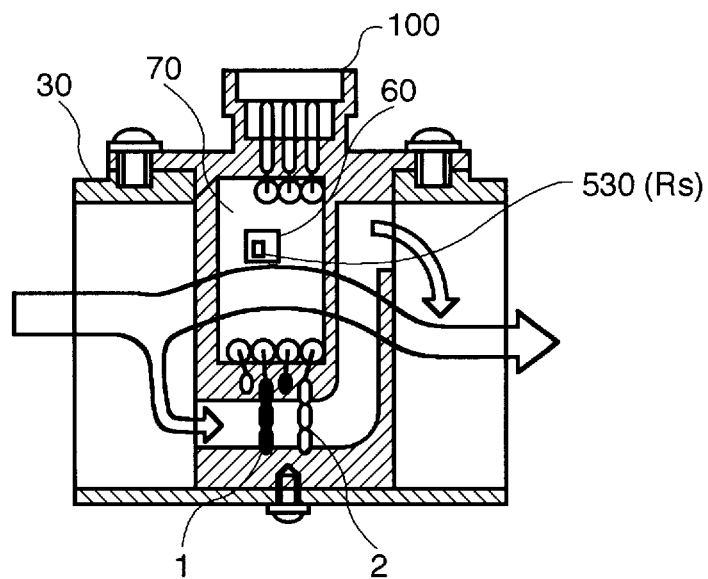
FIG. 10 is a sectional view of an air flow measuring part equipped with the air flow meter of a heating resistor type shown in FIG. 9.

FIG. 10 is a sectional view of an air flow measuring part equipped with the air flow meter of a heating resistor type shown in FIG. 9. In the air flow amount measuring part 100 of FIG. 10, the whole substrate 70 equipped with the IC chip 60 is provided in the air passage 30 or intake pipe for internal combustion engine, and the intake air is directly blown on the IC chip 60 and the monolithic resistor 530. Thereby, the temperature of the IC chip 60 and the monolithic resistor 530 is always maintained at the same temperature as the intake air, and thus it does not deteriorate the precision of correction.

In the case that the substrate 70 is exposed to intake air, it is desirable to integrate the resistors with different temperature coefficients, for example, the different kind of resistor 50, a resistor 510 or the thermistor 520, with the substrate 70 of the power amplifier circuit.

Figure 11:
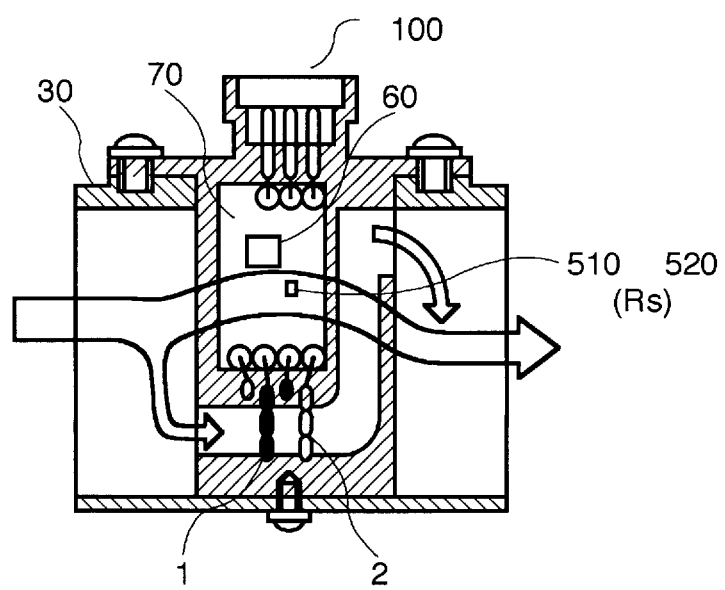
FIG. 11 is a sectional view of an air flow measuring part equipped with the air flow meter of a heating resistor type according to another embodiment of the present invention.

FIG. 11 is a sectional view of an air flow measuring part equipped with the air flow meter of a heating resistor type according to another embodiment of the present invention. In FIG. 11, the whole substrate 70 different from one shown in FIG. 10 is provided in the air passage 30. In the air flow amount measuring part 100 of FIG. 11, the whole substrate 70 equipped with the different kind of resistor 50, the resistor 510 or the thermistor 520, is provided in the air passage 30 or intake pipe for an internal combustion engine, and the intake air is directly blown on the resistor 510.

What is claimed is:

1. An air flow sensor comprising:

an air flow detector circuit having a heating resistor Rh, which air flow detector generates a sensor current Ih according to the equation $$Ih^2 Rh = (A + B\sqrt{Q})(Th - Ta)$$

wherein

A=f(Ta)

B=g(Ta)

Th=temperature of heating resistor

Ta=intake air temperature; and an amplifier circuit for amplifying a signal proportional to an output signal from the detector circuit, which output signal is proportional to Ih, said amplifier circuit comprising a first differential amplifier, at least a first resistor Rs having a reference resistance Rso and a temperature coefficient α, and at least a second resistor R having a reference resistance Ro and a temperature coefficient β, resistance values of said first and second resistors determining an amplification factor of said amplifier circuit;

wherein Rso, Ro, α and β are selected such that $$h^2(Ta) = \frac{1}{g(Ta)},$$

h(Ta) being a function of temperature dependent resistance of said at least a first resistor Rs and said at least a second resistor R, which function relates an output signal from the detector circuit to an output voltage of the air flow sensor.

2. An air flow sensor according to claim 1, wherein said signal which is proportional to said output signal from said detector circuit, and which is amplified by said differential amplifier, is determined by a voltage across said at least a first resistor Rs in a voltage divider circuit comprising said first resistor Rs and at least one second resistor R; and g(Ta) is a voltage divider function which relates a temperature dependent resistance of said at least a first resistor Rs to a total temperature dependent resistance of said at least a first resistor Rs and said at least one second resistor R.

3. An air flow sensor according to claim 1, wherein:

$$h(Ta) = \frac{(1 + \alpha)Rso}{(1 + \beta)Ro + (1 + \alpha)Rso}.$$

4. An air flow sensor according to claim 1, wherein:

said amplifier circuit comprises a second differential amplifier connected between an output of said detector circuit and an input of said first differential amplifier; and said at least one first resistor Rs and said at least a second resistor R are arranged in a feedback path of said second differential amplifier.

5. An air flow sensor according to claim 4, wherein h(Ta) a function of temperature dependent resistances of said at least a first resistor Rs and said at least a second resistor R, which resistances determine an amplification factor of said second differential amplifier.

* * * * *